(12) United States Patent
Drego et al.

(10) Patent No.: US 10,642,541 B2
(45) Date of Patent: May 5, 2020

(54) MACHINE PERCEPTION AND DENSE ALGORITHM INTEGRATED CIRCUIT

(71) Applicant: quadric.io, Inc., Burlingame, CA (US)

(72) Inventors: Nigel Drego, Burlingame, CA (US); Aman Sikka, Burlingame, CA (US); Mrinalini Ravichandran, Burlingame, CA (US); Ananth Durbha, Burlingame, CA (US); Robert Daniel Firu, Burlingame, CA (US); Veerbhan Kheterpal, Burlingame, CA (US)

(73) Assignee: quadric.io, Inc., Burlingame, CA (US)

( * ) Notice: Subject to any disclaimer, the term of this patent is extended or adjusted under 35 U.S.C. 154(b) by 0 days.

(21) Appl. No.: 16/590,999

(22) Filed: Oct. 2, 2019

(65) Prior Publication Data

US 2020/0034082 A1     Jan. 30, 2020

Related U.S. Application Data (63) Continuation of application No. 16/439,988, filed on Jun. 13, 2019, now Pat. No. 10,474,398, which is a continuation of application No. 16/290,064, filed on Mar. 1, 2019, now Pat. No. 10,365,860.

(60) Provisional application No. 62/640,478, filed on Mar. 8, 2018.

(51) Int. Cl.
*G06F 3/06* (2006.01)
*G06F 30/36* (2020.01)

(52) U.S. Cl.
CPC .......... *G06F 3/0688* (2013.01); *G06F 3/0655* (2013.01); *G06F 3/0685* (2013.01); *G06F 30/36* (2020.01)

(58) Field of Classification Search
None
See application file for complete search history.

(56) References Cited

U.S. PATENT DOCUMENTS

| 5,465,368 | A | 11/1995 | Davidson et al. |
| 5,522,085 | A | 5/1996 | Harrison et al. |
| 5,708,835 | A | 1/1998 | Burnett |
| 6,130,551 | A | 10/2000 | Agrawal et al. |
| 6,476,636 | B1 * | 11/2002 | Lien .................... G06F 17/5054 |
| | | | 326/38 |
| 6,800,884 | B1 * | 10/2004 | Feng ................ H03K 19/17736 |
| | | | 257/202 |

(Continued)

OTHER PUBLICATIONS

"International Search Report and Written Opinion of the ISA, dated Jun. 3, 2019, for application No. PCT/US19/20266."

(Continued)

*Primary Examiner* — Eric Coleman
(74) *Attorney, Agent, or Firm* — Padowithz Alce (57) ABSTRACT

A circuit that includes a plurality of array cores, each array core of the plurality of array cores comprising: a plurality of distinct data processing circuits; and a data queue register file; a plurality of border cores, each border core of the plurality of border cores comprising: at least a register file, wherein: [i] at least a subset of the plurality of border cores encompasses a periphery of a first subset of the plurality of array cores; and [ii] a combination of the plurality of array cores and the plurality of border cores define an integrated circuit array.

19 Claims, 4 Drawing Sheets

(56) References Cited

U.S. PATENT DOCUMENTS

| | | | |
|---|---|---|---|
| 6,867,615 B1 * | 3/2005 | Plants | H03K 19/1776 326/40 |
| 7,099,983 B2 * | 8/2006 | Emerson | G06F 13/16 370/402 |
| 7,111,155 B1 * | 9/2006 | Anderson | G06F 9/30014 712/208 |
| 7,577,820 B1 | 8/2009 | Wentzlaff et al. | |
| 8,572,353 B1 | 10/2013 | Bratt et al. | |
| 8,677,081 B1 | 3/2014 | Wentzlaff et al. | |
| 9,043,769 B2 | 5/2015 | Vorbach | |
| 9,213,652 B1 | 12/2015 | Miao et al. | |
| 9,432,298 B1 | 8/2016 | Smith | |
| 9,600,416 B2 * | 3/2017 | Ramanujan | G06F 12/0897 |
| 10,282,808 B2 | 5/2019 | Seiler et al. | |
| 2005/0093571 A1 * | 5/2005 | Suaris | G06F 17/5054 326/37 |
| 2007/0050603 A1 | 3/2007 | Vorbach et al. | |
| 2007/0226463 A1 | 9/2007 | Chaudhry et al. | |
| 2008/0010170 A1 | 1/2008 | Chan et al. | |
| 2009/0024836 A1 | 1/2009 | Shen et al. | |
| 2010/0180100 A1 * | 7/2010 | Lu | G06F 9/30032 712/22 |
| 2012/0089812 A1 | 4/2012 | Smith | |
| 2012/0110303 A1 | 5/2012 | Dhanwada et al. | |
| 2012/0216012 A1 | 8/2012 | Vorbach et al. | |
| 2013/0024826 A1 | 1/2013 | Master | |
| 2014/0173228 A1 * | 6/2014 | Lee | G06F 5/12 711/159 |
| 2015/0127877 A1 * | 5/2015 | Novellini | G06F 13/4282 710/316 |
| 2015/0242635 A1 | 8/2015 | Li et al. | |
| 2017/0293451 A1 | 10/2017 | Pan et al. | |
| 2017/0345122 A1 | 11/2017 | Seiler et al. | |
| 2018/0032335 A1 * | 2/2018 | Smith | G06F 9/30043 |

OTHER PUBLICATIONS

"International Search Report and Written Opinion of the ISA, dated May 23, 2019, for application No. PCT/US19/20652."

* cited by examiner

MACHINE PERCEPTION AND DENSE ALGORITHM INTEGRATED CIRCUIT

CROSS-REFERENCE TO RELATED APPLICATIONS

This application is a continuation of U.S. patent application Ser. No. 16/439,988, filed 13 Jun. 2019, which is a continuation of U.S. Pat. No. 10,365,860, filed 1 Mar. 2019, which claims the benefit of U.S. Provisional Application No. 62/640,478, filed 8 Mar. 2018, which are incorporated herein in their entireties by this reference.

TECHNICAL FIELD

The one or more inventions described herein relate generally to the integrated circuitry field, and more specifically to a new and useful perception and dense algorithm processing integrated circuitry architecture in the integrated circuitry field.

BACKGROUND

Modern applications of artificial intelligence and generally, machine learning appear to be driving innovations in robotics and specifically, in technologies involving autonomous robotics and autonomous vehicles. Also, the developments in machine perception technology have enabled the abilities of many of the implementations in the autonomous robotics' and autonomous vehicles' spaces to perceive vision, perceive hearing, and perceive touch among many other capabilities that allow machines to comprehend their environments.

The underlying perception technologies applied to these autonomous implementations include a number of advanced and capable sensors that often allow for a rich capture of environments surrounding the autonomous robots and/or autonomous vehicles. However, while many of these advanced and capable sensors may enable a robust capture of the physical environments of many autonomous implementations, the underlying processing circuitry that may function to process the various sensor signal data from the sensors often lack in corresponding robust processing capabilities sufficient to allow for high performance and real-time computing of the sensor signal data.

The underlying processing circuitry often include general purpose integrated circuits including central processing units (CPUs) and graphic processing units (GPU). In many applications, GPUs are implemented rather than CPUs because GPUs are capable of executing bulky or large amounts of computations relative to CPUs. However, the architectures of most GPUs are not optimized for handling many of the complex machine learning algorithms (e.g., neural network algorithms, etc.) used in machine perception technology. For instance, the autonomous vehicle space includes multiple perception processing needs that extend beyond merely recognizing vehicles and persons. Autonomous vehicles have been implemented with advanced sensor suites that provide a fusion of sensor data that enable route or path planning for autonomous vehicles. But, modern GPUs are not constructed for handling these additional high computation tasks.

At best, to enable a GPU or similar processing circuitry to handle additional sensor processing needs including path planning, sensor fusion, and the like, additional and/or disparate circuitry may be assembled to a traditional GPU. This fragmented and piecemeal approach to handling the additional perception processing needs of robotics and autonomous machines results in a number of inefficiencies in performing computations including inefficiencies in sensor signal processing.

Accordingly, there is a need in the integrated circuitry field for an advanced integrated circuit that is capable of high performance and real-time processing and computing of routine and advanced sensor signals for enabling perception of robotics or any type or kind of perceptual machine.

The inventors of the inventions described in the present application have designed an integrated circuit architecture that allows for enhanced sensor data processing capabilities and have further discovered related methods for implementing the integrated circuit architecture for several purposes including for enabling perception of robotics and various machines.

SUMMARY OF THE INVENTION

In one embodiment, an integrated circuit includes a plurality of array cores, each array core of the plurality of array cores comprising: a plurality of distinct data processing circuits; and a data queue register file; a plurality of border cores, each border core of the plurality of border cores comprising: at least a register file, wherein: [i] at least a subset of the plurality of border cores encompasses a periphery of a first subset of the plurality of array cores; and [ii] a combination of the plurality of array cores and the plurality of border cores define an integrated circuit array.

In one embodiment, the first subset of the plurality of array cores encompasses a periphery of a second subset of the plurality of array cores.

In one embodiment, the plurality of distinct processing circuits of each of the plurality of array cores comprises: a plurality of multiply accumulators, each of the plurality of multiply accumulators being arranged adjacent a data input/output port of a respective array core of the plurality of array cores.

In one embodiment, the circuit includes a first plurality of dual FIFOs that loads data into the integrated circuit array on a first-in, first-out basis, such that an oldest dataset entering a respective dual FIFO of the first plurality of dual FIFOs is first disposed by the respective dual FIFO, wherein the first plurality of dual FIFOs are arranged along a first peripheral side of the integrated circuit array; a second plurality of dual FIFOs that loads data into the integrated circuit array on a first-in, first-out basis, such that an oldest dataset entering a respective dual FIFO of the second plurality of dual FIFOs is first disposed by the respective dual FIFO, wherein the second plurality of dual FIFOs are arranged along a second peripheral side of the integrated circuit array that is distinct from the first peripheral side of the integrated circuit array.

In one embodiment, each of the first and the second plurality of dual FIFOs comprise at least two memory elements; a first of the at least two memory elements pushes data into one border core of the plurality of border cores of the integrated circuit array; a second of the at least two memory elements collects data from the one border core of the plurality of border cores of the integrated circuit array.

In one embodiment, each of the plurality of array cores having a rectangular shape or any suitable polygonal shape; and one of the plurality of multiply accumulators being arranged at each side of the rectangular shape of each of the plurality of array cores.

In one embodiment, the circuit includes a first periphery memory and a second periphery memory that interface with unified memory, wherein: the first periphery memory is arranged along a first peripheral side of the integrated circuit array and interfaces with a first periphery load store; and the second periphery memory is arranged along a second peripheral side of the integrated circuit array and interfaces with a second periphery load store.

In one embodiment, the circuit includes a hierarchical memory structure that enables direct memory access between a main memory and the integrated circuit array, the hierarchical memory structure includes: a plurality of dual FIFOs that interfaces with the integrated circuit array and transmits and accepts data on a first-in, first-out basis, a plurality of periphery load stores that each interface with a respective dual FIFO of the plurality of dual FIFOs and store one or more loads of data that is either received from the respective dual FIFO and/or that is pending a loading into the respective dual FIFO, and a plurality of periphery memory that each interface with a respective periphery load store of the plurality of periphery load stores and interfaces with the main memory.

In one embodiment, the circuit includes a plurality of periphery controllers that, when executing data movement instructions, control a movement of data between the hierarchical memory structure and the integrated circuit array.

In one embodiment, the hierarchical memory structure may be implemented as a two-dimensional direct memory access enabling data access and data reshaping during data transfers.

In one embodiment, the circuit includes a dispatch controller that provides: data movement instructions that causes an automatic movement of data: (a) between a hierarchical memory structure of the integrated circuit and the integrated circuit array; (b) within each respective array core of the plurality of array cores; (c) between respective array cores and between array cores and border cores of the integrated circuit array; and computation instructions that defines a plurality of computations to be executed by the plurality of array cores of the integrated circuit array.

In one embodiment, the circuit includes a dispatch controller that provides data movement instructions, wherein the data movement instructions comprise a data flow schedule that: defines an automatic movement of data within the integrated circuits; and sets one or more border cores of the plurality of border cores to a predetermined constant value if no data is provided to the one or more border cores according to the predetermined data flow schedule.

In one embodiment, the data flow schedule comprises a schedule of memory address executable by one or more of the plurality of periphery controllers.

In one embodiment, the circuit includes a dispatch controller that includes a compute instructions generator circuit that provides computation instructions for each of the plurality of array cores; and a data movement generator circuit that provides a data flow schedule that defines predetermined movements of data within the integrated circuit.

In one embodiment, the circuit includes a broadcast bus arranged in electrical communication with one or more periphery controllers at a first input terminal of the broadcast bus and in electrical communication with a subset of the plurality of array cores at a plurality of output terminals of the broadcast bus.

In one embodiment, each of the plurality of array cores is arranged in bi-directional communication with a neighboring core that includes one or more of the plurality array cores and the plurality of border cores.

DESCRIPTION OF THE PREFERRED EMBODIMENTS

The following description of preferred embodiments of the present application are not intended to limit the inventions to these preferred embodiments, but rather to enable any person skilled in the art of to make and use these inventions.

I. Overview

As discussed above in the background section, the state of the art in integrated circuit architecture lacks a suitable solution for handling the multitude of perception processing tasks of robotics and autonomous machines. While GPUs may be modified with additional and/or disparate circuitry to perform some of these perception processing requirements of robotics and autonomous machines, significant gaps in a GPU's processing capabilities exist such that the resulting performance is low and not in real-time. Other perception processing circuits may exist including neural network-specific processors, computer-vision-specific processors, and the like; however, none of these provide a single comprehensive integrated circuit that is capable of processing the many disparate perception algorithms and computations needed for sensor acquisition, sensor fusion, perception processing, path planning, and the like.

Accordingly, one or more embodiments of the present application function to provide a comprehensive optimized compute platform for processing perception algorithms, perception data (e.g., sensor data, observation data, and the like), and various perception processing requirements of robotics and autonomous machines. In preferred embodiments, the optimized compute platform may be implemented as a high performance and real-time processing dense algorithm processing unit (DAPU) and/or perception processing unit (PPU). In one or more implementations, the integrated circuit disclosed in the various embodiments of the present application includes an array core having a plurality of disparate processing elements and data flow and storage elements that operate to form a mesh architecture enabling the movement of data among and between many combinations of processing elements within the array core.

The mesh architecture defined by the plurality of processing elements in the array core preferably enable in-memory computing and mitigate communication and data processing latencies.

II. A System Architecture of a Dense Algorithm Processing Integrated Circuit

Figure 1:
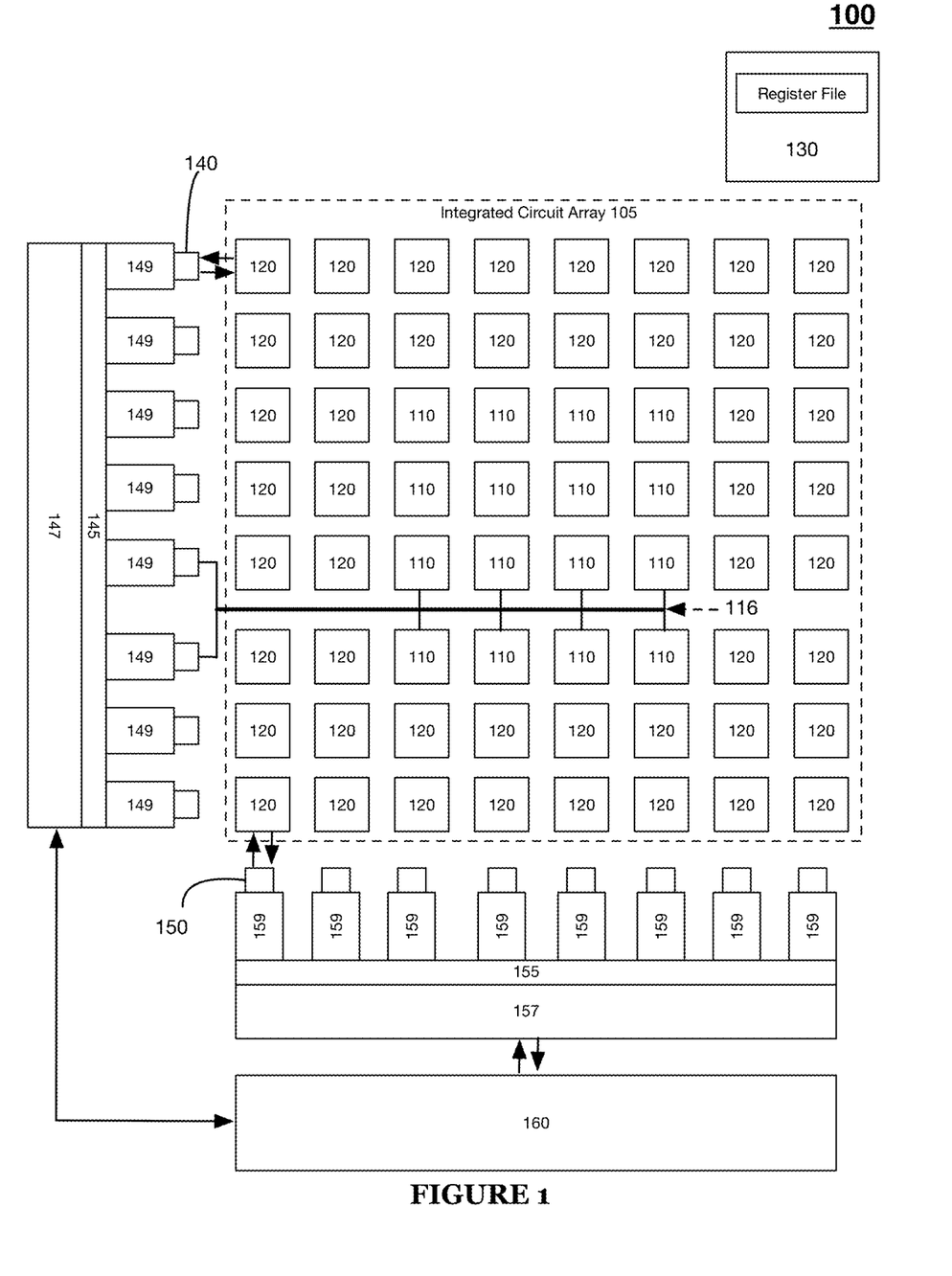
FIG. 1 illustrates a schematic of a system 10o in accordance with one or more embodiments of the present application.
Figure 1A:
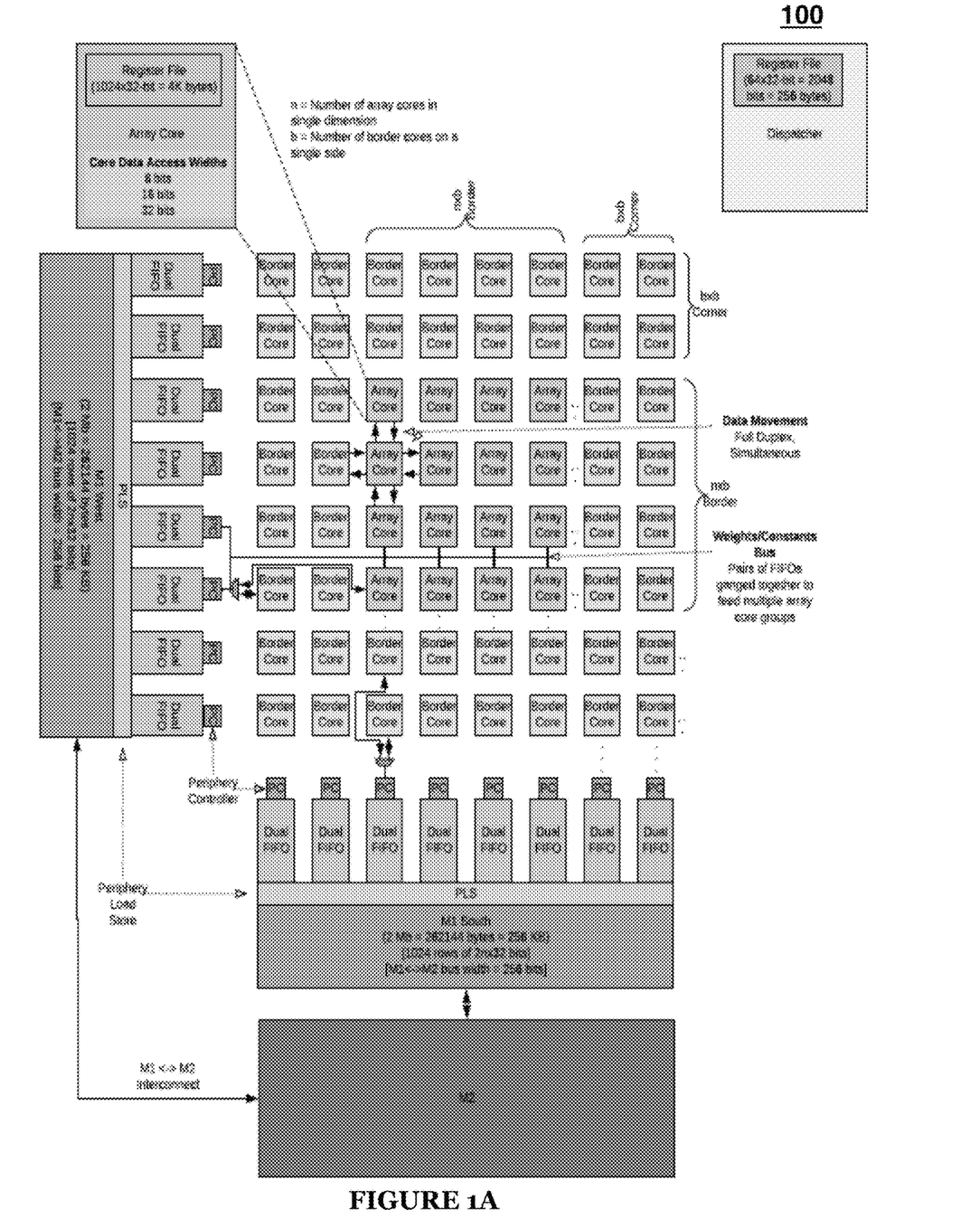
FIG. 1A illustrates an annotated schematic of a system 100 in accordance with one or more embodiments of the present application.

As shown in FIGS. 1-1A, the integrated circuit 100 (e.g., dense algorithm processing circuit and/or perception processing unit) for performing perception processing and/or any suitable type of data processing includes a plurality of array cores 110, a plurality of border cores 120, a dispatcher (main controller) 130, a first plurality of periphery controllers 140, a second plurality of periphery controllers 150, and main memory 160. The integrated circuit 100 may additionally include a first periphery load store 145, a second periphery load store 155, a first periphery memory 147, a second periphery memory 157, a first plurality of dual FIFOs 149, and a second plurality of dual FIFOs 159.

The integrated circuit 100 preferably functions to enable real-time and high computing efficiency of perception data and/or sensor data. A general configuration of the integrated circuit 100 includes a plurality of array core 110 defining central signal and data processing nodes each having large register files that may eliminate or significantly reduce clock cycles needed by an array core 110 for pulling and pushing data for processing from memory. The instructions (i.e., computation and data movement instructions) generating capabilities of the dispatcher 130 functions to enable a continuity and flow of data throughout the integrated circuit 100 and namely, within the plurality of array cores 110 and border cores 120.

An array core 110 preferably functions as a data or signal processing node (e.g., a small microprocessor) or processing circuit and preferably, includes a register file 112 having a large data storage capacity (e.g., 4 kilobyte (KB) or greater, etc.) and an arithmetic logic unit (ALU) 118 or any suitable digital electronic circuit that performs arithmetic and bitwise operations on integer binary numbers. In a preferred embodiment, the register file 112 of an array core 110 may be the only memory element that the processing circuits of an array core 110 may have direct access to. An array core 110 may have indirect access to memory outside of the array core and/or the integrated circuit array 105 (i.e., core mesh) defined by the plurality of border cores 120 and the plurality of array cores 110.

The register file 112 of an array core 110 may be any suitable memory element or device, but preferably comprises one or more static random-access memories (SRAMs). The register file 112 may include a large number of registers, such as 1024 registers, that enables the storage of a sufficiently large data set for processing by the array core 110. Accordingly, a technical benefit achieved by an arrangement of the large register file 112 within each array core 110 is that the large register file 112 reduces a need by an array core 110 to fetch and load data into its register file 112 for processing. As a result, a number of clock cycles required by the array core 112 to push data into and pull data out of memory is significantly reduced or eliminated altogether. That is, the large register file 112 increases the efficiencies of computations performed by an array core 110 because most, if not all, of the data that the array core 110 is scheduled to process is located immediately next to the processing circuitry (e.g., one or more MACs, ALU, etc.) of the array core 110. For instance, when implementing image processing by the integrated circuit 100 or related system using a neural network algorithm(s) or application(s) (e.g., convolutional neural network algorithms or the like), the large register file 112 of an array core may function to enable a storage of all the image data required for processing an entire image. Accordingly, most or if not, all layer data of a neural network implementation (or similar compute-intensive application) may be stored locally in the large register file 112 of an array core 110 with the exception of weights or coefficients of the neural network algorithm(s), in some embodiments. Accordingly, this allows for optimal utilization of the computing and/or processing elements (e.g., the one or more MACs and ALU) of an array core 110 by enabling an array core 110 to constantly churn data of the register file 112 and further, limiting the fetching and loading of data from an off-array core data source (e.g., main memory, periphery memory, etc.).

By comparison, to traverse a register file in a traditional system implemented by a GPU or the like, it is typically required that memory addresses be issued for fetching data from memory. However, in a preferred embodiment that implements the large register file 112, the (raw) input data within the register file 112 may be automatically incremented from the register file 112 and data from neighboring core(s) (e.g., array cores and/or border cores) are continuously sourced to the register file 112 to enable a continuous flow to the computing elements of the array core 110 without an express need to make a request (or issuing memory addresses) by the array core 110. In particular, in one or more embodiments of the present application, to enable the continuous flow register pointers may be simultaneously deferenced and auto-incremented to traverse the large register file 112 extremely efficiently.

While in some embodiments of the present application, a predetermined data flow scheduled may mitigate or altogether, eliminate requests for data by components within the integrated circuit array 105, in a variant of these embodiments traditional random memory access may be achieved by components of the integrated circuit array 105, as described in U.S. Provisional Application No. 62/802,346, which incorporated herein in its entirety by this reference. That is, if an array core 110 or a border core 120 recognizes a need for a random piece of data for processing, the array core 110 and/or the border 120 may make a specific request for data (i.e., issue a memory address) from any of the memory elements within the memory hierarchy of the integrated circuit 100.

An array core 110 may, additionally or alternatively, include a plurality of multiplier (multiply) accumulators (MACs) 114 or any suitable logic devices or digital circuits that may be capable of performing multiply and summation functions. In a preferred embodiment, each array core 110 includes four (4) MACs and each MAC 114 may be arranged at or near a specific side of a rectangular shaped array core 110, as shown by way of example in FIG. 2. While, in a preferred embodiment each of the plurality of MACs 114 of an array core 110 may be arranged near or at the respective sides of the array core 110, it shall be known that the plurality of MACs 114 may be arranged within (or possibly augmented to a periphery of an array core) the array core 110 in any suitable arrangement, pattern, position, and the like including at the respective corners of an array core 110. In a preferred embodiment, the arrangement of the plurality of MACs 114 along the sides of an array core 110 enables efficient inflow or capture of input data received from one or more of the direct neighboring cores (i.e., an adjacent neighboring core) and the computation thereof by the array core 110 of the integrated circuit 100. That is, each of the plurality of MACs 114 may be arranged directly next to or arranged in direct electrical communication with a data port (or the like) of an array core 110. Thus, in such embodiments, if an array core 110 includes a data port at each of a northern most side, an eastern most side, a southern most side, and a western most side of an array core 110, each data port may correspondingly have a distinct MAC 114 that is in direct communication with one of the respective ports. In this way, data arriving at a respective data port may be transmitted directly into a MAC 114 for computation and similarly, data that has been computed by a MAC 114 may be directly output to a data port for transmission to another site or array core 114.

Figure 2:
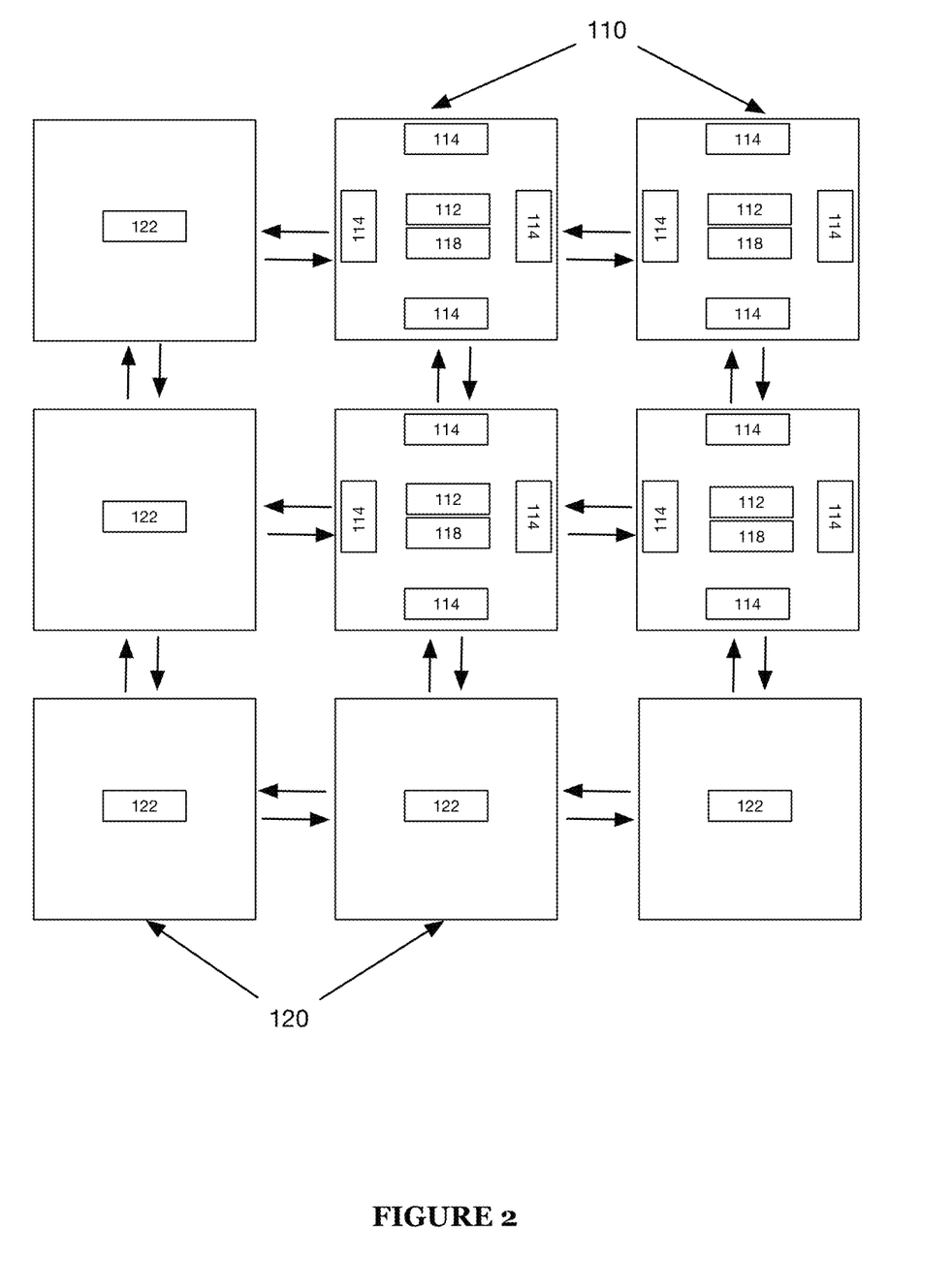
FIG. 2 illustrates a detailed schematic of a segment of the integrated circuit array 105 in accordance with one or more embodiments of the present application.

Accordingly, each of the plurality of MACs 114 positioned within an array core 110 may function to have direct communication capabilities with neighboring cores (e.g., array cores, border cores, etc.) within the integrated circuit 100. The plurality of MACs 114 may additionally function to execute computations using data (e.g., operands) sourced from the large register file 112 of an array core 110. However, the plurality of MACs 114 preferably function to source data for executing computations from one or more of their respective neighboring core(s) and/or a weights or coefficients (constants) bus 116 that functions to transfer coefficient or weight inputs of one or more algorithms (including machine learning algorithms) from one or more memory elements (e.g., main memory 160 or the like) or one or more input sources.

The weights or broadcast bus 116 may be operably placed in electrical communication with at least one or more of periphery controllers 140, 150 at a first input terminal of the weights bus 116 and additionally, operably and/or electrically connected with one or more of the plurality of array core 110 at one or more output terminals of the weights bus 116. In this way, the weight bus 116 may function to collect weights and coefficients data input from the one or more periphery controllers 140, 150 and transmit the weights and coefficients data input directly to one or more of the plurality of array cores 110. Accordingly, in some embodiments, multiple array cores 110 may be fed weights and/or coefficients data input via the weights bus 116 in parallel to thereby improve the speed of computation of the array cores 110.

Each array core 110 preferably functions to bi-directionally communicate with its direct neighbors. That is, in some embodiments, a respective array core 110 may be configured as a processing node having a rectangular shape or ay suitable polygonal shape and arranged such that each side of the processing node may be capable of interacting with another node (e.g., another processing node, a data storage/movement node, etc.) that is positioned next to one of the four sides or each of the faces of the array core 110. The ability of an array core 110 to bi-directionally communicate with a neighboring core along each of its sides enables the array core 110 to pull in data from any of its neighbors as well as push (processed or raw) data to any of its neighbors. This enables a mesh communication architecture that allows for efficient movement of data throughout the collection of array and border cores 110, 120 of the integrated circuit 100.

Each of the plurality of border cores 120 preferably includes a register file 122. The register file 122 may be configured similar to the register file 112 of an array core 110 in that the register file 122 may function to store large datasets. Preferably, each border core 120 includes a simplified architecture when compared to an array core 110. Accordingly, a border core 120 in some embodiments may not include execution capabilities and therefore, may not include multiplier-accumulators and/or an arithmetic logic unit as provided in many of the array cores 110.

In a traditional integrated circuit (e.g., a GPU or the like), when input image data (or any other suitable sensor data) received for processing compute-intensive application (e.g., neural network algorithm) within such a circuit, it may be necessary to issue padding requests to areas within the circuit which do not include image values (e.g., pixel values) based on the input image data. That is, during image processing or the like, the traditional integrated circuit may function to perform image processing from a memory element that does not contain any image data value. In such instances, the traditional integrated circuit may function to request that a padding value, such as zero, be added to the memory element to avoid subsequent image processing efforts at the memory element without an image data value. A consequence of this typical image data processing by the traditional integrated circuit results in a number of clock cycles spent identifying the blank memory element and adding a computable value to the memory element for image processing or the like by the traditional integrated circuit.

In a preferred implementation of the integrated circuit 100, one or more of the plurality of border cores 120 may function to automatically set to a default value when no input data (e.g., input sensor data) is received. For instance, input image data from a sensor (or another circuit layer) may have a total image data size that does not occupy all border core cells of the integrated circuit array 105. In such instance, upon receipt of the input image data, the one or more border cores 120 (i.e., border core cells) without input image data may be automatically set to a default value, such as zero or a non-zero constant value.

In some embodiments, the predetermined input data flow schedule generated by the dispatcher and sent to one or more of the plurality of border cores 120 may include instructions to set to a default or a predetermined constant value. Additionally, or alternatively, the one or more border cores 120 may be automatically set to a default or a predetermined value when it is detected that no input sensor data or the like is received with a predetermined input data flow to the integrated circuit array 105. Additionally, or alternatively, in one variation, the one or more border cores 120 may be automatically set to reflect values of one or more other border cores having input sensor data when it is detected that no input sensor data or the like is received with a predetermined input data flow to the integrated circuit array 105.

Accordingly, a technical benefit achieved according to the implementation of one or more of the plurality of border cores 120 as automatic padding elements, may include increasing efficiencies in computation by one or more of the plurality of array cores 110 by minimizing work requests to regions of interest (or surrounding areas) of input sensor data where automatic padding values have been set. Thereby, reducing clock cycles used by the plurality of array core 110 in performing computations on an input dataset.

In a preferred implementation of the integrated circuit 100, the progression of data into the plurality of array cores 110 and the plurality of border cores 120 for processing is preferably based on a predetermined data flow schedule generated at the dispatcher 130. The predetermined data flow schedule enables input data from one or more sources (e.g., sensors, other NN layers, an upstream device, etc.) to be loaded into the border cores 120 and array cores 110 without requiring an explicit request (e.g., without issuing memory addresses) for the input data from the border cores 120 and/or array cores 110. That is, the predetermined data flow schedule enables an automatic flow of raw data from memory elements (e.g., main memory 160), such as on-chip or off-chip memory, of the integrated circuit 100 to the plurality of border cores 120 and the plurality of array cores 110 having capacity to accept data for processing. For instance, in the case that an array core 110 functions to process a first subset of data of a data load stored in its register file 112, once the results of the processing of the first subset of data is completed and sent out from the array core 110, the predetermined data flow schedule may function to enable an automatic flow of raw data into the array core 110 that adds to the data load at the register file 112 and replaces the first subset of data that was previously processed by the array core 110. Accordingly, in such instance, no explicit request for additional raw data for processing is required from the array core 110. Rather, the integrated circuit 100 implementing the dispatcher 130 may function to recognize that once the array core 110 has processed some amount of data sourced from its register file 112 (or elsewhere) that the array core 110 may have additional capacity to accept additional data for processing. It shall be explicitly noted that the predetermined data flow schedule may additionally function to enable an automatic flow of processed data within the integrated circuit array 105 as well as out of the integrated circuit array 105.

The dispatcher 130 preferably includes processing circuitry (e.g., microprocessor or the like) that function to create instructions that include scheduled computations or executions to be performed by various circuits and/or components (e.g., array core computations) of the integrated circuit 100 and further, create instructions that enable a control a flow of input data through the integrated circuit 100. In some embodiments, the dispatcher 130 may function to execute part of the instructions and load another part of the instructions into the integrated circuit array 105. In general, the dispatcher 130 may function as a primary controller of the integrated circuit 100 that controls and manages access to or a flow (movement) of data from memory to the one or more other storage and/or processing circuits of the integrated circuit 100 (and vice versa). Additionally, the dispatcher 130 may function control execution operations of the various sub-controllers (e.g., periphery controllers, etc.) and the plurality of array cores 110.

Figure 3:
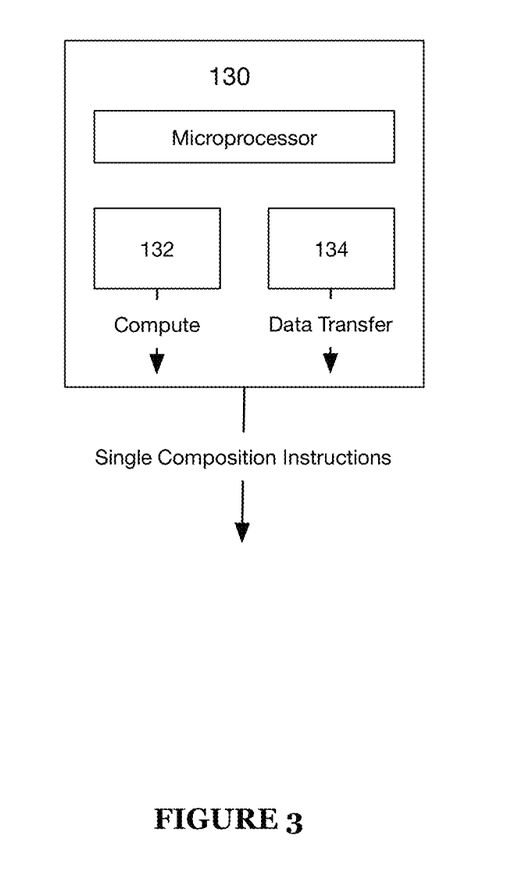
FIG. 3 illustrates a schematic of an integrated circuit controller in accordance with one or more embodiments of the present application.

As shown by way of example in FIG. 3, in some embodiments, the processing circuitry of the dispatcher 130 includes disparate circuitry including a compute instruction generator circuit 132 and a data movement instructions generator circuit 134 (e.g., address generation unit or address computation unit) that may independently generate computation/execution instructions and data transfers/movements schedules or instructions, respectively. Accordingly, this configuration enables the dispatcher 130 to perform data address calculation and generation of computation/execution instructions in parallel. The dispatcher 130 may function to synthesize the output from both the computer instructions generator circuit 132 and the data movement instructions generator circuit 134 into a single instructions composition that combines the disparate outputs.

The single instructions composition generated by the dispatcher 130 may be provided to the one or more downstream components and integrated circuit array 105 and allow for computation or processing instructions and data transfer/movement instructions to be performed simultaneously by these various circuits or components of the integrated circuit 100. With respect to the integrated circuit array 105, the data movement component of the single instructions composition may be performed by one or more of periphery controllers 140, 150 and compute instructions by one or more of the plurality of array cores 110. Accordingly, in such embodiment, the periphery controllers 140, 150 may function to decode the data movement component of the instructions and if involved, may perform read operations from the dual FIFOs 149, 159 and move that data from the dual FIFOs 149, 159 onto a data bus to the integrated circuit array 105 (or vice versa).

It shall be noted that while the compute instructions generator circuit 132 and the data movement instructions generator circuit 134 are preferably separate or independent circuits, in some embodiments the compute instructions generator circuit 132 and the data movement instructions generator circuit 134 may be implemented by a single circuit that functions to perform both compute instructions generation and data movement instruction generation.

In operation, the dispatcher 130 may function to generate and schedule memory addresses to be loaded into one or more of the periphery load store 145 and the periphery load store 155. The periphery load stores 145, 155 preferably include specialized execution units that function to execute all load and store instructions from the dispatcher 130 and may generally function to load or fetch data from memory or storing the data back to memory from the integrated circuit array core 105. The first periphery load store 145 preferably communicably and operably interfaces with both the first plurality of dual FIFOs 149 and the first periphery memory 147. The first and the second periphery memory 147, 157 preferably comprise on-chip static random-access memory.

In this configuration, the first periphery load store 145 may be arranged between the first plurality of dual FIFOs 149 and the first periphery memory 147 such that the first periphery load store 145 is positioned immediately next to or behind the first plurality of dual FIFOs 149. Similarly, the second periphery load store 155 preferably communicably and operably interfaces with both the second plurality of dual FIFOs 159 and the second periphery memory 157. Accordingly, the second periphery load store 155 may be arranged between the second plurality of dual FIFOs 159 and the second periphery memory 157 such that the second periphery load store 155 is positioned immediately next to or behind the second plurality of dual FIFOs 159.

In response to memory addressing instructions issued by the dispatcher 130 to one or more of the first and the second periphery load stores 145, 155, the first and the second periphery load stores 145, 155 may function to execute the instructions to fetch data from one of the first periphery memory 147 and the second periphery memory 157 and move the fetched data into one or more of the first and second plurality of dual FIFOs 149, 159. Additionally, or alternatively, the dual FIFOs 149, 159 may function to read data from a data bus and move the read data to one or more of the respective dual FIFOs or read data from one or more of the dual FIFOs and move the read data to a data bus. Similarly, memory addressing instructions may cause one or more of the first and the second periphery load stores 145, 155 to move data collected from one or more of the plurality of dual FIFOs 149, 159 into one of the first and second periphery memory 147, 157.

Each of the first plurality of dual FIFOs 149 and each of the second plurality of dual FIFOs 159 preferably comprises at least two memory elements (not shown). Preferably, the first plurality of dual FIFOs 149 may be arranged along a first side of the integrated circuit array 105 with each of the first plurality of dual FIFOs 149 being aligned with a row of the integrated circuit array 105. Similarly, the second plurality of dual FIFOs 159 may be arranged along a second side of the integrated circuit array 105 with each of the second plurality of dual FIFOs 159 being aligned with a column of the integrated circuit array 105. This arrangement preferably enables each border core 120 along the first side of the integrated circuit array 105 to communicably and operably interface with at least one of the first periphery controllers 145 and each border 120 along the second side of the integrated circuit array 105 to communicably and operably interface with at least one of the second periphery controllers 155.

While it is illustrated in at least FIGS. 1-1A that there are a first and second plurality of dual FIFOs, first and second periphery controllers, first and second periphery memories, and first and second load stores, it shall be noted that these structures may be arranged to surround an entire periphery of the integrated circuit array 105 such that, for instance, these components are arranged along all (four) sides of the integrated circuit array 105.

The dual FIFOs 149, 159 preferably function to react to specific instructions for data from their respective side. That is, the dual FIFOs 149, 159 may be configured to identify data movement instructions from the dispatcher 130 that is specific to either the first plurality of dual FIFOs 149 along the first side or the second plurality of dual FIFOs 159 along the second side of the integrated circuit array 105.

According to a first implementation, each of the dual FIFOs may use a first of the two memory elements to push data into the integrated circuit array 105 and second of the two memory elements to pull data from the integrated circuit array 105. Thus, each dual FIFO 149, 159 may have a first memory element dedicated for moving data inward into the integrated circuit array 105 and a second memory element dedicated for moving data outward from the integrated circuit array 105. That is, in this first implementation, the first memory element of a dual FIFO may function to load data from the dual FIFO into a border core of the integrated circuit array 105. Conversely, the second memory element of a dual FIFO preferably functions to collect data that is moving of a border core of the integrated circuit array 105. It shall be noted that, in some embodiments, it may be possible to load data and/or collect data by the first and second memory elements of a dual FIFO from an array core by bypassing the border cores, potentially via a data bus or the like.

According to a second implementation, the dual FIFOs may be operated in a stack (second) mode in which each respective dual FIFO functions to provide data into the integrated circuit array 105 in a predetermined sequence or order and collect the data from the integrated circuit array 105 in the same predetermined sequence or order in which the data was sourced into the integrated circuit array 105. In this second implementation, the data within each respective dual FIFO may be handled on a first-in, first-out basis and each respective dual FIFO, per se, may be implemented to load and/or collect data on a first-in, first-out basis. Additionally, or alternatively, in another mode of operating each respective dual FIFO, the data within each respective dual FIFO may be handled on a last-in, first-out basis and similarly be implemented to load and/or collected data in a same manner. Additionally, or alternatively, each respective dual FIFO may be addressed in other modes that include a combination of the aforementioned modes as well as in a random access mode.

Additionally, the integrated circuit 100 preferably includes main memory 160 comprising a single unified memory. The main memory 160 preferably functions to store data originating from one or more sensors, system-derived or generated data, data from one or more integrated circuit layers, data from one or more upstream devices or components, and the like. Preferably, the main memory 160 comprises an on-chip static random-access memory or the like.

Additionally, or alternatively, main memory 160 may include multiple levels of on-die (on-chip) memory. In such embodiments, the main memory 160 may include multiple memory (e.g., SRAM) elements that may be in electrical communication with each other and function as a single unified memory that is arranged on a same die as the integrated circuit array 105.

Additionally, or alternatively, main memory 160 may include multiple levels of off-die (off-chip) memory (not shown). In such embodiments, the main memory 160 may include multiple memory (e.g., DDR SRAM, high bandwidth memory (HBM), etc.) elements that may be in electrical communication with each other and function as a single unified memory that is arranged on a separate die than the integrated circuit array.

It shall be noted that in some embodiments, the integrated circuit 100 includes main memory 160 comprising memory arranged on-die and off-die. In such embodiments, the on-die and the off-die memory of the main memory 160 may function as a single unified memory accessible to the on-die components of the integrated circuit 100.

Each of the first periphery memory 147 and the second periphery memory 157 may port into the main memory 160. Between the first periphery memory 147 and the main memory 160 may be arranged a load store unit that enables the first periphery memory 147 to fetch data from the main memory 160. Similarly, between the second periphery memory 157 and the main memory 160 may be arranged a second load store unit that enables the second periphery memory 157 to fetch data from the main memory 160.

It shall be noted that the data transfers along the memory hierarchy of the integrated circuit 100 occurring between dual FIFOs 149, 159 and the load stores 145, 155, between the load stores 145, 155 and the periphery memory 147, 157, and the periphery memory 147, 157 and the main memory 160 may preferably be implemented as prescheduled or predetermined direct memory access (DMA) transfers that enable the memory elements and load stores to independently access and transfer data within the memory hierarchy without direct intervention of the dispatcher 130 or some main processing circuit. Additionally, the data transfers within the memory hierarchy of the integrated circuit 100 may be implemented as two-dimensional (2D) DMA transfers having two counts and two strides thereby allowing for efficient data access and data reshaping during transfers within the memory hierarchy and between the memory hierarchy and the integrated circuit array 105. In a preferred embodiment, the DMA data transfers may be triggered by a status or operation of one or more of the plurality of array cores 110. For instance, if an array core is completing or has completed a processing of a first set of data, the completion or near-completion may trigger the DMA transfers to enable additional data to enter the integrated circuit array 105 for processing.

The system and methods of the preferred embodiment and variations thereof can be embodied and/or implemented at least in part as a machine configured to receive a computer-readable medium storing computer-readable instructions. The instructions are preferably executed by computer-executable components preferably integrated with the system and one or more portions of the processor and/or the controller. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the implementations of the systems and methods described herein.

As a person skilled in the art will recognize from the previous detailed description and from the figures and claims, modifications and changes can be made to the preferred embodiments of the invention without departing from the scope of this invention defined in the following claims.

What is claimed is:

1. An integrated circuit comprising:
    a plurality of array cores, each array core of the plurality of array cores comprising:
        a plurality of distinct data processing circuits, at least one of the plurality of distinct data processing circuits being arranged along each interior side of each array core; and
        a data queue register file;
    wherein:
        a combination of the plurality of array cores define an integrated circuit array;
    a first plurality of dual FIFOs that load data into the integrated circuit array on a first-in, first-out basis, such that an oldest dataset entering a respective dual FIFO of the first plurality of dual FIFOs is first disposed by the respective dual FIFO,
    wherein the first plurality of dual FIFOs are arranged along a first peripheral side of the integrated circuit array;
    a second plurality of dual FIFOs that load data into the integrated circuit array on a first-in, first-out basis, such that an oldest dataset entering a respective dual FIFO of the second plurality of dual FIFOs is first disposed by the respective dual FIFO, wherein the second plurality of dual FIFOs are arranged along a second peripheral side of the integrated circuit array that is distinct from the first peripheral side of the integrated circuit array.

2. The integrated circuit according to claim 1, further comprising:
    a plurality of border cores, each border core of the plurality of border cores comprising:
        at least a register file, wherein:
        [i] a combination of the plurality of array cores and the plurality of border cores define the integrated circuit array; and
        [ii] a subset of the plurality of border cores define one or more peripheral sides of the integrated circuit array.

3. The integrated circuit according to claim 1, wherein the plurality of distinct processing circuits of each of the plurality of array cores comprises:
    a plurality of multiply accumulators, each of the plurality of multiply accumulators being arranged adjacent a data input/output port of a respective array core of the plurality of array cores.

4. The integrated circuit according to claim 1, wherein the plurality of distinct data processing circuits surround the data queue register file.

5. The integrated circuit according to claim 1, wherein each of the plurality of array cores further comprises at least one arithmetic logic unit.

6. The integrated circuit according to claim 5, wherein:
    the at least one arithmetic logic unit is arranged adjacent the data queue register file, and
    the plurality of distinct data processing circuits surround the data queue register file and the arithmetic logic unit.

7. The integrated circuit according to claim 1, wherein a first subset of the plurality of array cores encompasses a periphery of a second subset of the plurality of array cores.

8. The integrated circuit according to claim 2, further comprising:
    a first plurality of dual FIFOs that load data into the integrated circuit array on a first-in, first-out basis, wherein:
        the first plurality of dual FIFOs are arranged along a first peripheral border of the integrated circuit array,
        the first peripheral border being defined by a subset of the plurality of border cores, and
        each of the first plurality of dual FIFOs loads data directly into an adjacent one of the subset of the plurality of border cores.

9. The integrated circuit according to claim 8, further comprising:
    a second plurality of dual FIFOs that load data into the integrated circuit array on a first-in, first-out basis, wherein:
        the second plurality of dual FIFOs are arranged along a second peripheral border of the integrated circuit array,
        the second peripheral border being defined by a distinct subset of the plurality of border cores, and
        each of the second plurality of dual FIFOs loads data directly into an adjacent one of the distinct subset of the plurality of border cores.

10. The integrated circuit according to claim 1, wherein:
    each of the first and the second plurality of dual FIFOs comprise at least two memory elements;
    a first of the at least two memory elements pushes data into one of a border core of the plurality of border cores and an array core of the plurality of array cores of the integrated circuit array;
    a second of the at least two memory elements collects data from the one of a border core of the plurality of border cores and an array core of the plurality of array cores of the integrated circuit array.

11. The integrated circuit according to claim 3, wherein:
    each of the plurality of array cores having a rectangular shape; and
    each one of the plurality of multiply accumulators being arranged along one side of the rectangular shape of each of the plurality of array cores.

12. The integrated circuit according to claim 1, further comprising:
    a first periphery memory and a second periphery memory that interface with unified memory, wherein:
    the first periphery memory is arranged along a first peripheral side of the integrated circuit array and interfaces with a first periphery load store; and
    the second periphery memory is arranged along a second peripheral side of the integrated circuit array and interfaces with a second periphery load store.

13. The integrated circuit according to claim 1, further comprising:
    a hierarchical memory structure that enables direct memory access between a main memory and the integrated circuit array, the hierarchical memory structure includes:
        a plurality of dual FIFOs that interface with the integrated circuit array and transmit and accept data on a first-in, first-out basis,
        a plurality of periphery load store that each interface with a respective dual FIFO of the plurality of dual FIFOs and store one or more loads of data that is either received from the respective dual FIFO or that is pending a loading into the respective dual FIFO, and a plurality of periphery memory that each interface with a respective periphery load store of the plurality of periphery load stores and interfaces with the main memory.

14. The integrated circuit according to claim 1, further comprising:
a plurality of periphery controllers that, when executing data movement instructions, control a movement of data between the hierarchical memory structure and the integrated circuit array.

15. The integrated circuit according to claim 13, wherein the hierarchical memory structure being implemented as
a two-dimensional direct memory access enabling data access and data reshaping during data transfers.

16. An integrated circuit comprising:
a plurality of array cores, each array core of the plurality of array cores comprising:
a plurality of distinct data processing circuits, at least one of the plurality of distinct data processing circuits being arranged along each interior side of each array core; and
a data queue register file;
wherein:
a combination of the plurality of array cores define an integrated circuit array;
a plurality of border cores, each border core of the plurality of border cores comprising:
at least a register file, wherein:
[i] a combination of the plurality of array cores and the plurality of border cores define the integrated circuit array; and
[ii] a subset of the plurality of border cores define one or more peripheral sides of the integrated circuit array;
a dispatch controller that provides:
(i) data movement instructions that causes an automatic movement of data: (a) between a hierarchical memory structure of the integrated circuit and the integrated circuit array; (b) within each respective array core of the plurality of array cores; (c) between respective array cores and between array cores and border cores of the integrated circuit array; and
(ii) computation instructions that define a plurality of computations to be executed by the plurality of array cores of the integrated circuit array.

17. An integrated circuit comprising:
a plurality of array cores, each array core of the plurality of array cores comprising:
a plurality of distinct data processing circuits, at least one of the plurality of distinct data processing circuits being arranged along each interior side of each array core; and
a data queue register file;
wherein:
a combination of the plurality of array cores define an integrated circuit array;
a plurality of border cores, each border core of the plurality of border cores comprising:
at least a register file, wherein:
[i] a combination of the plurality of array cores and the plurality of border cores define the integrated circuit array; and
[ii] a subset of the plurality of border cores define one or more peripheral sides of the integrated circuit array;
a dispatch controller that provides data movement instructions, wherein the data movement instructions comprise a data flow schedule that:
(i) defines an automatic movement of data within the integrated circuits; and
(ii) sets one or more border cores of the plurality of border cores to a predetermined constant value if no data is provided to the one or more border cores according to the predetermined data flow schedule,
wherein the data flow schedule comprises a schedule of memory addresses executable by one or more of a plurality of periphery load stores.

18. The integrated circuit according to claim 1, further comprising: a dispatch controller comprising:
a compute instructions generator circuit that provides computation instructions for each of the plurality of array cores; and
a data movement generator circuit that provides a data flow schedule that defines predetermined movements of data within the integrated circuit.

19. The integrated circuit according to claim 1, further comprising:
a broadcast bus arranged in electrical communication with one or more periphery controllers at a first input terminal of the broadcast bus and in electrical communication with a subset of the plurality of array cores at a plurality of output terminals of the broadcast bus.

* * * * *